United States Patent
Chen et al.

(10) Patent No.: US 7,294,202 B2
(45) Date of Patent: Nov. 13, 2007

(54) PROCESS FOR MANUFACTURING SELF-ASSEMBLED NANOPARTICLES

(75) Inventors: Wei-Kuo Chen, Hsinchu (TW); Ming-Chih Lee, Hsinchu (TW); Wu-Ching Chou, Houlong Township, Miaoli County (TW); Wen-Hsiung Chen, Hsinchu (TW); Wen-Cheng Ke, Yuanli Township, Miaoli County (TW)

(73) Assignee: National Chiao Tung University, Hsinchu (TW)

( * ) Notice: Subject to any disclaimer, the term of this patent is extended or adjusted under 35 U.S.C. 154(b) by 348 days.

(21) Appl. No.: 11/005,547

(22) Filed: Dec. 6, 2004

(65) Prior Publication Data

US 2006/0029792 A1 Feb. 9, 2006

(30) Foreign Application Priority Data

Aug. 9, 2004 (TW) .............................. 93123806 A (51) Int. Cl.
*C30B 29/60* (2006.01)

(52) U.S. Cl. .............................. 117/94; 117/95; 117/96

(58) Field of Classification Search .................. 117/94, 117/95, 96

See application file for complete search history.

(56) References Cited

U.S. PATENT DOCUMENTS

2004/0168626 A1 * 9/2004 Moeck et al. .................. 117/84

2004/0175844 A1 * 9/2004 Yang et al. ..................... 438/2

FOREIGN PATENT DOCUMENTS

| JP | 9283737 | 10/1997 |
| JP | 10289996 | 10/1998 |

OTHER PUBLICATIONS

L. Sugiura et al., "Dislocation Motion in GaN Light-emitting Devices and its Effect on Device Lifetime" J. Appl. Phys. 81, 1633 (1996).

Arakawa et al. "Multidimensional Quantum Well Laser and Temperature Dependence of its Threshold Current" Journal of Crystal Growth 237, 1312 (1982).

(Continued)

*Primary Examiner*—Robert Kunemund
(74) *Attorney, Agent, or Firm*—Bucknam and Archer (57) ABSTRACT

Process for fabricating self-assembled nanoparticles on buffer layers without mask making and allowing for any degree of lattice mismatch; that is, binary, ternary or quaternary nanoparticles comprising Groups III-V, II-VI or IV-VI. The process includes a first step of applying a buffer layer, a second step of turning on the purge gas to modulate the first reactant to the lower first flow rate, then the second reactant is supplied to the buffer layer to form a metal-rich island on the buffer layer, and a third step of turning on purge gas again to modulate the first reactant to the higher second flow rate onto the buffer layer. On the metal-rich island is formed the nanoparticles of the binary, ternary or quaternary III-V, II-VI and IV-IV semiconductor material. This is then recrystallized under the first reactant flow at high temperature forming high quality nanoparticles.

30 Claims, 11 Drawing Sheets

OTHER PUBLICATIONS

Daudin et al., "Stranski-Krastanov Growth Mode during the Molecular Beam Epitaxy of Highly Strained GaN," Phys. Rev. B 56, 7069 (1997).

Miyamura et al., "High density and Size-Controlled GaN Self-Assembled QDs Grown by MOCVD" Appl. Phys. Lett. 80, 3937 (2002).

Tanaka et al. "Self-Assembling GaN Quantum Dots on AlGaN Surfaces Using a Surfactant" Appl. Phys. Lett. 69, 4096 (1996).

Arakawa et al. "Fabrication of GaN Quantum Dots by Metalorganic Chemical Vapor Selective Deposition" Journal of Crystal Growth 237, 1312 (2002).

Wei-Kuo Chen et al. "Formation of Self-Organized GaN Dots on Al0.11Ga0.89N by Alternating Supply of Source Precursors," Japanese Journal of Applied Physic, vol. 43, No. 6B, 2004, pp. L780-783, Jun. 2004.

* cited by examiner

PROCESS FOR MANUFACTURING SELF-ASSEMBLED NANOPARTICLES

FIELD OF THE INVENTION

The present invention relates to a novel manufacture technology of nanoparticles, particularly to periodic flow rate modulation epitaxy growth process.

The present invention is applicable to the production of a variety of heterostructure electronic and optoelectronic semiconductor devices and a variety of electronic and optoelectronic semiconductor products, for example, the production of single electron transistors, light emitting diodes, laser diodes, optical memory and photodiodes. Said optoelectronic semiconductor products are further applicable to indoor and outdoor luminous equipments, auto luminescence, traffic lights, liquid crystal display backlits or mobile phone backlits, advertisement panels, copy machines, DVD read-write heads, as well as single electron transistors and related nano-scale products.

DESCRIPTION OF THE RELATED PRIOR ART

Figure 1:
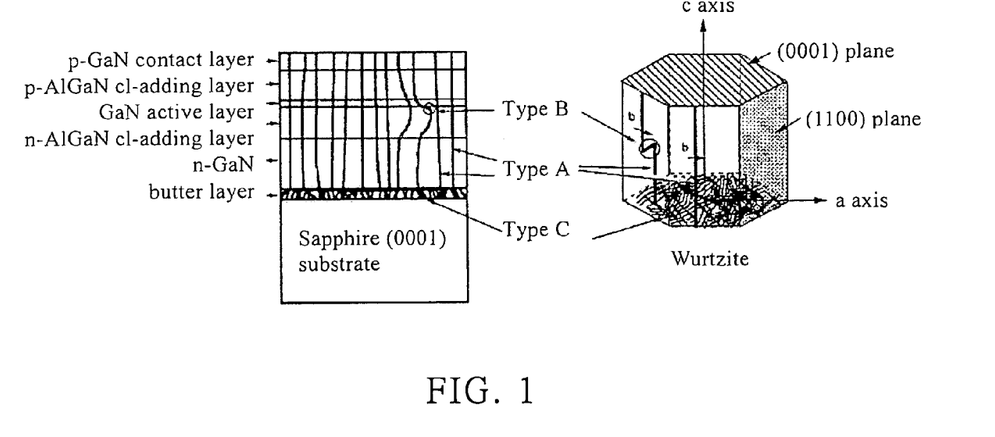
FIG. 1 is a scheme showing the dislocation distribution in a conventional light emitting diode.

It has always been an object for industries and academia in the field of production of electronic and optoelectronic semiconductor devices to elevate the features of devices, such as luminescence efficiency, power consumption, and temperature stability. For example, referring to the structure of blue light emitting diode shown in FIG. 1 (L. Sugiura, J. Appl. Phys. 81, 1633 (1997)), the critical factors affecting its luminescence efficiency are, first, the design of active layer; and second, the lattice mismatch issues. The design of active layer enables the luminescence efficiency to elevate with the development progress in layer structure from the early p/n interface, through double-heterogeneous (DH) structure, to recent multi-quantum-well (MQW) structure. On the other hand, the lattice mismatch issues between substrate and epilayer or barrier layer and well layer materials in MQW structure impact the luminescence efficiency due to the generation of many defects, such as dislocation and stacking fault, since these defects accompanied generally by a high concentration of nonradiation recombination center, and result recombined carriers unable to release energy in the form of light rather of heat, and concomitant sharply lowering of luminescence efficiency. Therefore, the discussion in this field on the production technologies of optoelectronic semiconductor devices relating to the elevation of the luminescence efficiency focused on the design of active layer and the selectivity of the degree of lattice mismatch for material system.

According to the researches in recent years, in blue light emitting diodes produced with InGaN/GaN multi-quantum-well, there are InGaN nanoparticles self-formed inside the well region of MQW structure when the composition of In is increased, and the luminescence efficiency of these emitting devices is effectively and greatly elevated due to the carrier localization effect of these nanoparticles. When the size of semiconductor materials is miniaturized from micro- to nano-scale as nanoparticles, the three-dimensional carrier localization effect is created inside said nanoparticles, and also the energy state density therein is of discreteness like atomic level. In 1982, Y. Arakawa, Professor of Japan Tokyo University, predicted that laser diodes (LD) produced with nanoparticles would greatly elevate the luminescence efficiency based on low-dimensional feature in nanoparticles, while having superior features as lower threshold current (45 A/cm$^2$, which is ⅛ of that of quantum well laser diodes) and higher temperature stability.

With the above low-dimensional feature due to the discrete density of states in nanoparticles, lights in red, green and blue wavelength ranges are obtained by controlling the geometric size of nanoparticles, and white light source is obtained by combining lights in these three color wavelength ranges. This technical concept is potential in the application on the production of white light emitting diodes (LED) with high luminescence efficiency, high color rendering index and low cost. On the other hand, the application of nanoparticles also comprises single electron transistors (SET) which is activated with only one electron, in comparison to 100,000 electrons in conventional transistors, so that the starting voltage is reduced to $\frac{1}{100,000}$ of that of conventional transistors and there are advantages like low material consumption, low operation power. Therefore, this technology has been attracting a lot of researches from many semiconductor manufacturers in the world in recent years.

The conventional technologies for growing nanoparticles comprise: (1) the most common Stranski-Krastanow (S-K) growth mode; (2) Anti-surfactants growth method; and (3) selective growth method.

Figure 2:
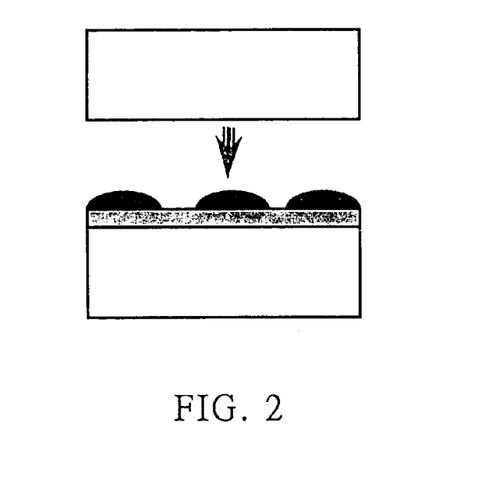
FIG. 2 is a scheme showing the growth of conventional S-K growth mode nanoparticles.
Figure 3:
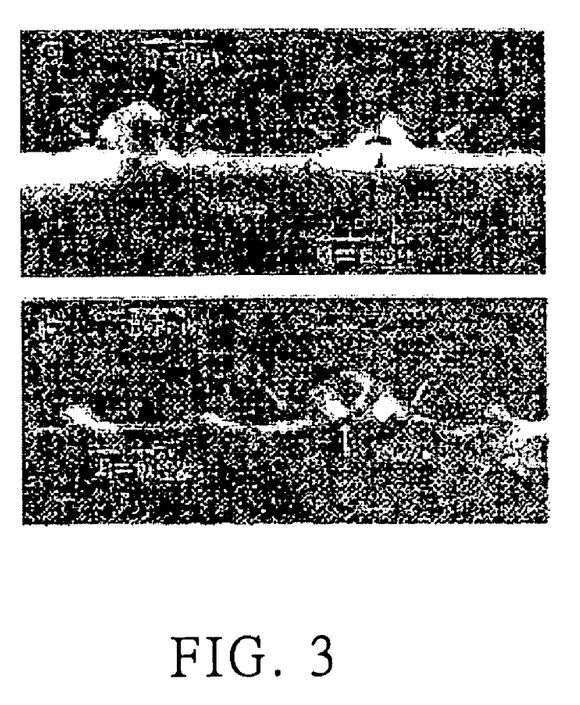
FIG. 3 is a cross-sectional TEM image showing the growth of $In_{0.5}Ga_{0.5}As$ nanoparticles on GaAs buffer layer with conventional S-K growth mode.

The prerequisite of S-K growth mode (shown in FIG. 2) is the degree of lattice mismatch between buffer layer and epitaxial film has to be more than 2%, and when epitaxial film growth is reaching at thickness of critical (tc), the accumulated strain energy ($\gamma$, strain(tc)) has to satisfy the condition formula for S-K mode nanoparticle growth, i.e., surface energy of buffer layer ($\gamma$, buffer)<surface energy of epitaxial film ($\gamma$, epi)+interface strain energy (i.e. surface energy of interface between buffer layer and epitaxial film ($\gamma$, interface)+strain energy ($\gamma$, strain(tc))). Having satisfied this condition enables epitaxial film growth mode transform from two-dimensional layer-by-layer growth to three-dimensional island growth, which growth mode transform method is currently widely applied to the manufacture of nanoparticles by Groups III-V or II-VI compound semiconductor materials with the degree of lattice mismatch of 5~7%, such as InAs/GaAs, ZnTe/ZnSe. JP 10289996 and JP 9283737 of Nakada Yoshiaki et al. disclosed a technology using S-K growth mode, which grows InAs nanoparticles on GaAs buffer layer; further, Daudin et al. disclosed in Phys. Rev. B 56, 7069 (1997), "Stranski-Krastanov growth mode during the molecular beam epitaxy of highly strained GaN", that firstly a sapphire substrate is disposed into growth chamber of MBE system, the substrate is subject to nitridation treatment in nitrogen plasma environment, and to grow an AlN buffer layer with thickness of 15 ML at temperature of 500° C., then to grow a GaN buffer layer with thickness of 2 μm while temperature is elevated to 650° C., thereafter to grow an AlN buffer layer with thickness of 200 nm, and to grow GaN nanoparticles of 4 ML at temperature of 710° C. In addition, Miyamura et al. disclosed in Appl. Phys. Lett., 80, 3937 (2002), "High density and size-controlled GaN self-assembled QDs grown by MOCVD" in 2002, that GaN nanoparticles are grown on AlN buffer layer by low-pressure metal-organic vapor phase deposition system (MOVPE) under pressure of 200 torr, while trimethylaluminum (TMAl) and trimethylgallium (TMGa) are used as source precursors for Group III, and ammonia (NH$_3$) for Group V. However, the above nanoparticles manufactured by the above growth mode transform methods are formed with defects like dislocation and stacking fault due to lattice mismatch between buffer layer and epitaxial layer, which impacts the optoelectric features of the nanoparticles themselves. Besides, S-K growth mode can only be applicable to material systems with the degree of lattice mismatch of more than 2%, which greatly reduces the selectivity of the nanoparticle materials to be grown. For example, the currently widely used Group III nitride material system in optoelectronic elements like blue light emitting diodes, blue laser diodes is limited to aluminum nitride (AlN) material (the degree of lattice mismatch thereof is 2.4%) to adapt to gallium nitride (GaN) buffer layer in said S-K mode; which is subject to grow GaN wetting layer with tc=2~4 ML, then to form three-dimensional GaN nanoparticles on AlN buffer layer. However, due to the almost insulation feature of AlN, the manufactured GaN/AlN nanoparticle material has no specific contribution to the element production.

Anti-surfactants growth modes provided to overcome the drawback of S-K growth mode that only limited material systems can be applied to the manufacture of nanoparticles. Tanaka et al. of Japan Physical-Chemistry Institute disclosed a technology in Appl. Phys. Lett. 69, 4096, "Self-assembling GaN quantum dots on AlGaN surfaces using a surfactant" in 1996, that it is subject to grow GaN nanoparticles on $Al_{0.15}Ga_{0.85}N$ buffer layer with low degree of lattice mismatch (~0.3%); which comprises steps: turn triethylsilicon (TESi) on $Al_{0.15}Ga_{0.85}N$ buffer layer to reduce the surface energy thereof before growing GaN nanoparticles, so that the nanoparticle growth condition formula to grow GaN nanoparticles: $\gamma_{AlGaN(Si)} < \gamma_{GaN} + \gamma_{interface}$ is satisfied.

Selective growth mode was disclosed by Professor Arakawa of Tokyo University and his research group in Journal of Crystal Growth 237, 1312 (2002) "Fabrication of GaN quantum dots by metal organic chemical vapor selective deposition" in 2002, which is subject to produce $SiO_2$ pattern mask on buffer layer firstly, subsequently to grow hexagonal structure at place without $SiO_2$ pattern mask, then to grow multi-quantum-well structure thereon; Arakawa et al. considered that there are nanoparticles formed on tips of the hexagonal bodies. However, this process for the manufacture of nanoparticles needs additional pattern mask that increases production cost, which is not desirable to the application of nanoparticle-related optoelectronic semiconductor elements.

SUMMARY OF THE INVENTION

With intensive studies and confirmation through many experiments, the inventor herein presents a novel and inventive process for manufacturing self-assembled nanoparticles, wherein the nanoparticles characteristically comprise two components, such as Groups III-V, II-VI or IV-IV, or three or more components and can be formed on buffer layers of any degree of lattice mismatch by self-assembled process without additional production of pattern mask.

Said process is firstly to grow buffer layer of any material on a substrate, then the periodic flow-rate modulation is made in proper temperature range, and comprises: turn on purge gas and modulate the first reactant into the lower first molar flow rate range before turning on the second reactant, so that the turn-on second reactant is able to form metal or metal-rich compound islands on the buffer layer; turn on purge gas again to remove any residual second reactant which does not incorporate to form metal or metal-rich compound islands; and modulate the first reactant into the higher second molar flow rate range, so that said metal or metal-rich compound islands can be grown into nanoparticles. Finally, recrystallization is made at higher growth temperature after the periodic flow-rate modulated epitaxy growth is completed, to form high quality nanoparticles.

The novelty and non-obviousness of the present invention has been proved by the fact that, the related theory and data have been accepted by Japanese Journal of Applied Physics, and the content of the invention has been published in June 2004 issue of said publication (Wei-Kuo Chen et al., "Formation of Self-organized GaN Dots on $Al_{0.11}Ga_{0.89}N$ by Alternating Supply of Source Precursors", Japanese Journal of Applied Physic, Vol. 43, No. 6B, 2004, pp. L780-783, June 2004).

DETAILED DESCRIPTION OF THE INVENTION

The first object of the present invention is to provide a novel process for manufacturing nanoparticles, which is applicable to the production of optoelectronic semiconductor elements, effectively elevates the luminescence efficiency of the elements, reduces power consumption, and obtains higher temperature stability.

The second object of the present invention is to provide a process for manufacturing nanoparticles by self-assembled process. By said self-assembled process, nanoparticles can be grown on buffer layers of any materials, and the selectivity of the nanoparticle materials is increased. The process for manufacturing nanoparticles by self-assembled process according to the present invention can further grow nanoparticles on buffer layers with extremely low degree of lattice mismatch, even with same lattices, to reduce the defect density inside nanoparticles. According to the second object, said process can grow nanoparticles on buffer layers of any materials without the production of pattern mask, therefore the production cost of elements is reduced.

According to the process for manufacturing nanoparticles of the present invention, nanoparticles are grown by periodic flow-rate modulation epitaxial growth, which is characterized that a novel self-assembled process and elimination of production of pattern mask, and comprises steps: firstly grow buffer layer of any material on a substrate, then the periodic flow-rate modulation epitaxy is made in proper temperature range, and the so-called "periodic flow-rate modulation epitaxial growth" comprises: turn on purge gas and modulate the first reactant into the lower first molar flow rate range before turning on the second reactant, so that the turn-on second reactant is able to grow metal or metal-rich compound islands on the buffer layer; turn on purge gas again to clean remaining second reactant which does not form metal or metal-rich compound islands; and modulate the first reactant into the higher second molar flow rate range, so that said metal or metal-rich compound islands can be grown into nanoparticles. Finally, recrystallization is made at higher growth temperature after the periodic flow-rate modulation epitaxial growth is completed, to form high quality nanoparticles with excellent structure.

In the periodic flow-rate modulation epitaxial growth, metal or metal-rich compound islands are formed by Volmer-Webber (V-W) growth mode, i.e., surface energy of buffer layer $\gamma_{,buffer}$<surface energy of metal or metal-rich compound islands $\gamma_{,island}$+interface strain energy of interface between buffer layer and metal or metal-rich compound islands ($\gamma_{,interface}$+$\gamma$, strain(tc)), or under the condition that the degree of lattice mismatch between buffer layer and metal or metal-rich compound islands >10% should be satisfied. Therefore, metal or metal-rich compound islands are formed mainly by modulating the content of the first reactant to a range below the first molar flow rate to satisfy the growth condition of V-W mode, and the first reactant does not react with the second one to form two-dimensional layer-by-layer grown compound film, rather to form metal or metal-rich compound islands.

Figure 4:
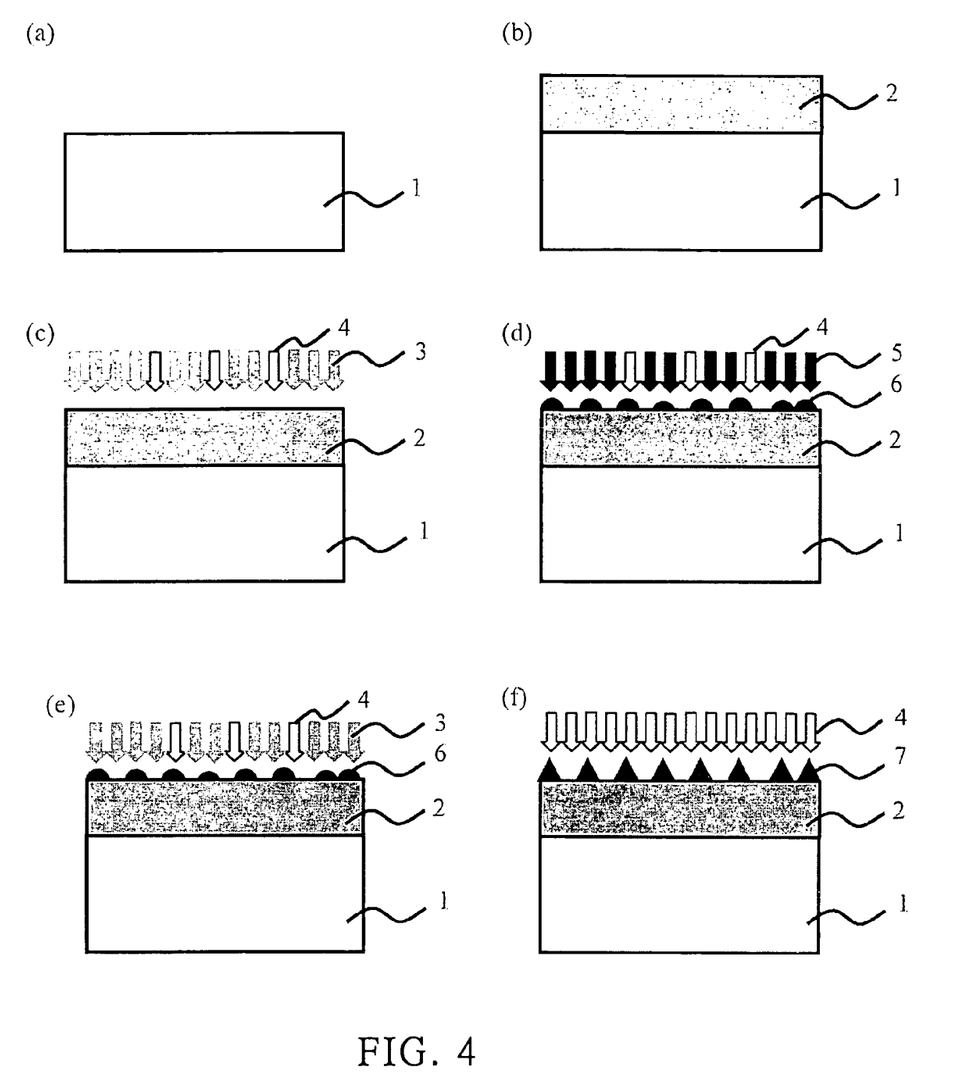
FIG. 4 is a scheme showing the principle of the periodic flow-rate modulation epitaxy growth nanoparticles according to the present invention.

The theory of the periodic flow-rate modulation epitaxial growth according to the present invention is shown in FIG. 4. First, substrate 1 is provided (FIG. 4(a)), and buffer layer 2 is grown on the substrate (FIG. 4(a)). Purge gas 3 is turned on and the first reactant 4 is modulated to a range below the first molar flow rate (FIG. 4(c)), so that the second reactant 5 turned on thereafter forms metal or metal-rich compound islands 6 on the buffer layer (FIG. 4(d)). After the formation of said island, purge gas is turned on to clean remaining second reactant which does not form islands (FIG. 4(e)). Subsequently, the first reactant 4 is modulated to a range above the second molar flow rate (FIG. 4(f)), so that said islands form high quality nanoparticles 7 with excellent structure under sufficient first reactant molar flow rate, and a growth cycle is completed. The geometric shape and size can be controlled through modulating the first and second reactant molar flow rates and the turn-on time.

The third object of the present invention is to form nanoparticles of three components or more, in addition to that of two components.

Nanoparticles of two components comprising Groups III-V, II-VI or IV materials is formed by self-assembled process, and meet the specification of a variety of nanoparticle type semiconductor elements. Table 1 sets forth the lattice constant and surface energy of the most commonly used Groups II, III and IV metals in current production of semiconductor elements. In the present growth mode of nanoparticles of two components, the first reactant includes all elements of Groups V, VI and IV of the Periodic Table, the second reactant includes all elements of Groups III, II and IV; therefore, the grown nanoparticles are Groups III-V, II-VI and IV-IV compounds. In addition, in the periodic flow-rate modulation epitaxial growth according to the invention, it is possible to form with a plurality of reactants, so that nanoparticles of three or four components can be grown.

TABLE 1

| Metal | Lattice constant and surface energy of Groups II, III, and IV metals | | | | | | |
|---|---|---|---|---|---|---|---|
| | Gallium (Ga) | Aluminum (Al) | Indium (In) | Zinc (Zn) | Cadmium (Cd) | Silicon (Si) | Germanium (Ge) |
| Lattice Constant (Å) | 4.15 | 4.05 | 3.25 | 2.66 | 2.98 | 5.431 | 5.658 |
| Surface Energy (meV/Å$^2$) | 44.8 | 58.7 | 35.4 | 49.2 | 38.1 | 55.4 | 33.1 |

Figure 7:
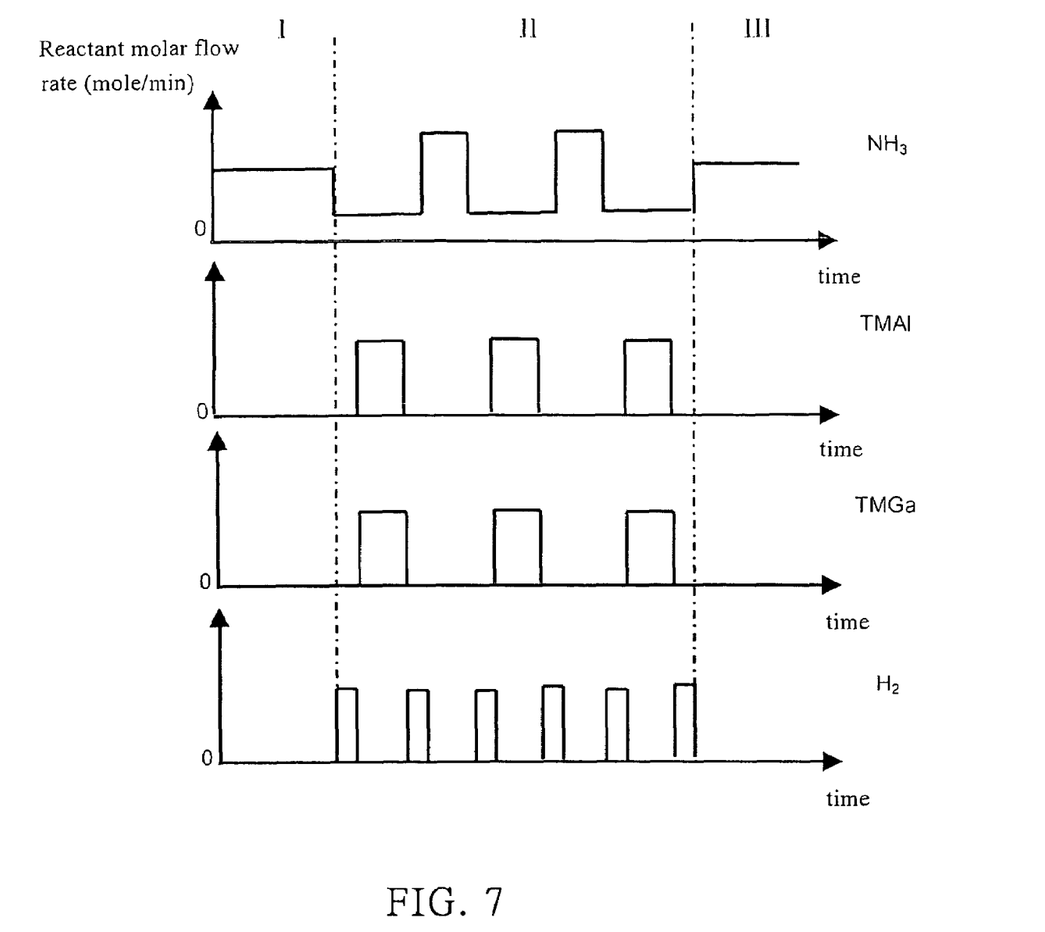
FIG. 7 is a time chart showing the growth of ternary nanoparticles while turning on the second and third reactants simultaneously in the periodic flow-rate modulation epitaxy according to the present invention.
Figure 8:
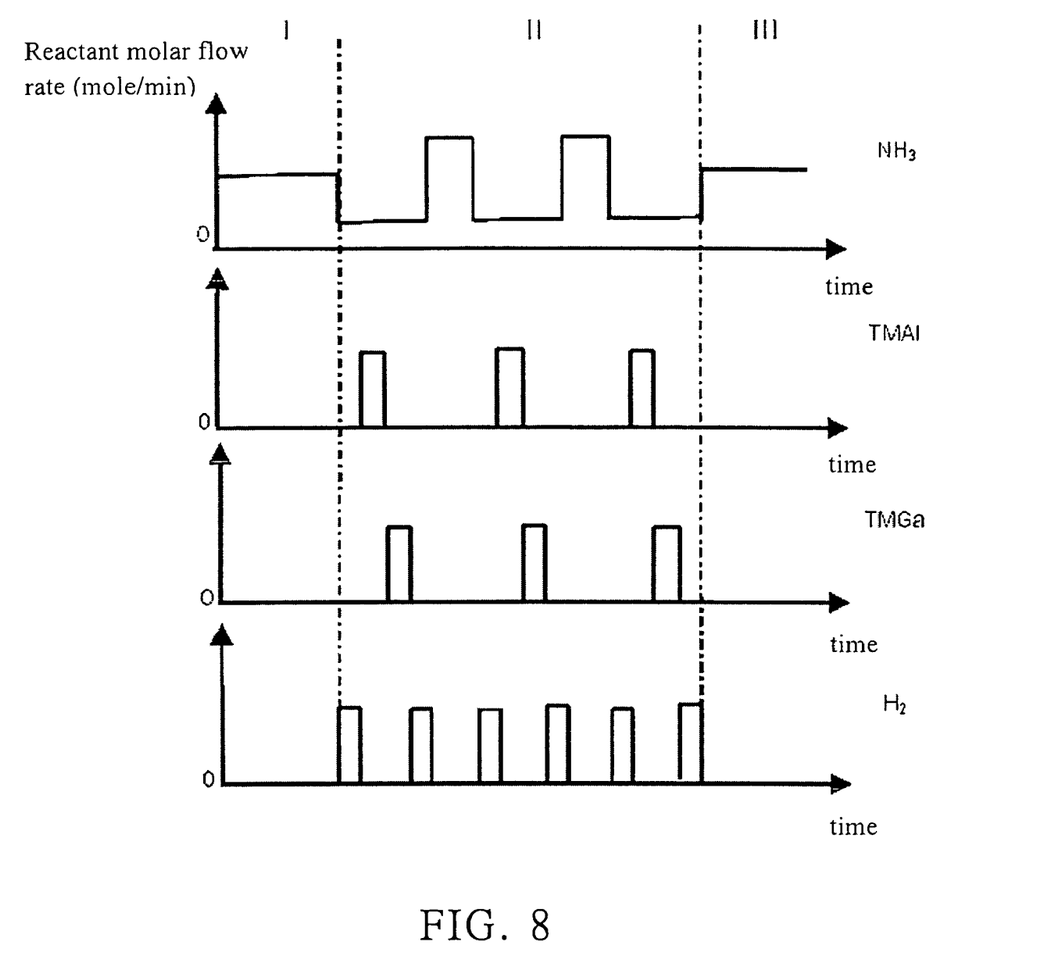
FIG. 8 is a time chart showing the growth of ternary nanoparticles while turning on the second reactant prior to the third one in the periodic flow-rate modulation epitaxy according to the present invention.
Figure 9:
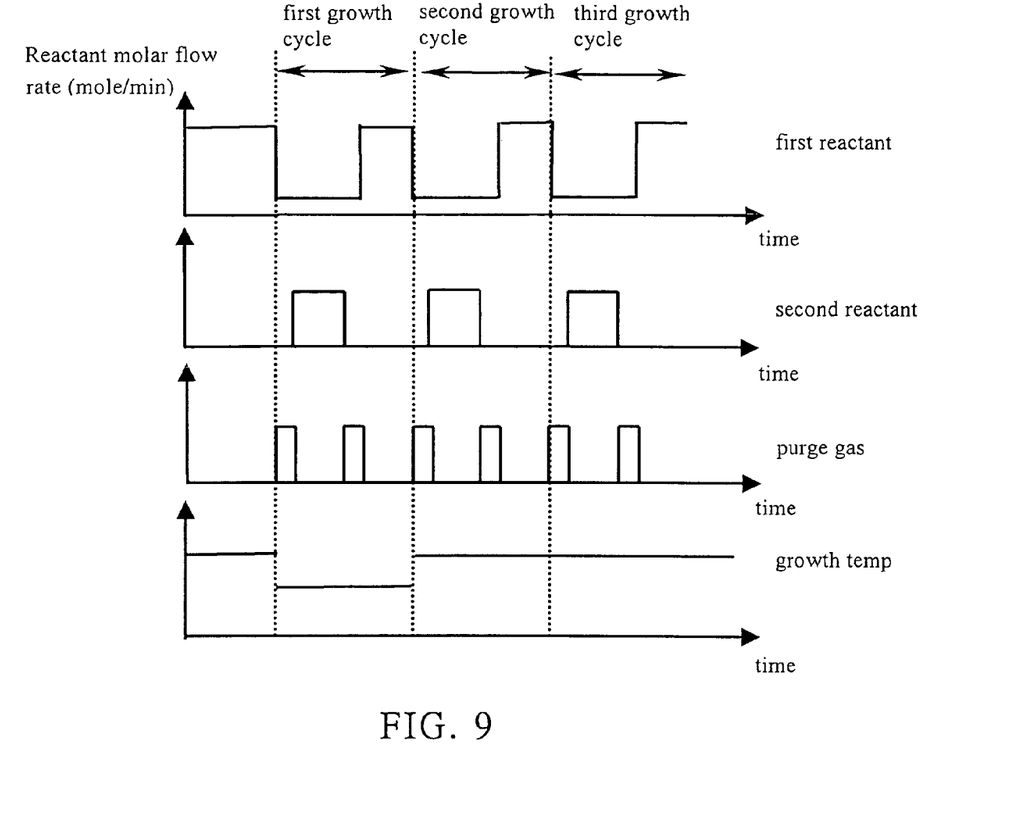
FIG. 9 is a time chart showing the growth of nanoparticles with a plurality of growth cycles by temperature modulation to grow high density, high quality nanoparticles in the periodic flow-rate modulation epitaxy according to the present invention.

As the growth mode of nanoparticles of three or more components, according to the above periodic flow-rate modulation epitaxy, it comprises steps: when nanoparticles of three or more components with three reactants are grown, the reactant molar flow rate modulation procedures are, after modulating the first reactant molar flow rate below the first molar flow rate, turn on the second and third reactants simultaneously (as shown in FIG. 7), or turn on the second reactant first and then the third reactant (as shown in FIG. 8), to form metal or metal-rich compound islands consisting of the second and third reactant elements on buffer layer; and elevate the first reactant molar flow rate to the higher second molar flow rate and form nanoparticles of three components with better structure, which include: AlGaAs, InGaAs, AlInAs, AlGaP, InGaP, AlInP, AlAsP, InAsP, GaAsP, AlGaN, InGaN, AlInN, AlAsN, InAsN, GaAsN, ZnCdSe, ZnHgSe, ZnCdTe, ZnSeTe, SiCGe, SICN etc. Accordingly, the same procedures can be used for the growth of nanoparticles of four or more components with four reactants, which include: AlInGaAs, AlInGaP, AlInAsP, InGaAsP, AlAsPN, InAsPN, GaAsPN, AlInGaN, etc.

As to nanoparticles of two and three components manufactured according to the above second and third objects, they are also applicable to the production of UV-LED (with emitting wavelength lower than 370 nm) which can be mixed with R-G-B tricolor fluorescence powders to produce white LED with color rendering index of higher than 90%. The interesting UV-LED production technology developed by Taiwanese manufacturers is based on AlGaN (by elevating the composition of Al to reach shorter wavelength, preferably 280 or 254 nm, which is similar to the fluorescence powders applied to conventional); however, AlGaN films with high Al composition have very poor quality, so that the luminescence efficiency of the AlGaN-based UV-LED production technology is not good. The luminescence efficiency of the UV-LED produced from the above manufactured nanoparticles of two and three and more components, particularly GaN and AlGaN nanoparticles, are greatly elevated.

The final object of the present invention is to provide nanoparticles with high quality and excellent structure.

The present invention is further to control the density and structure quality by two or more temperature modulation processes, which firstly forms high density islands at lower temperature, and then elevate the growth temperature to recrystallize said island, so that nanoparticles with excellent structure are formed. Further, the growth of said nanoparticles can be through a plurality of growth cycles to control the geometric shape and size of the nanoparticles.

When nanoparticles are grown through a plurality of growth cycles, firstly islands of high density are formed at lower temperature during the first growth cycle, and the growth temperature is elevated after the second growth cycle to grow nanoparticles with excellent structure. It comprises turning on the second reactant at the lower first growth temperature to form high-density metal gallium or gallium-rich compound island, then turning on the first reactant after elevating the growth temperature to the higher second growth temperature to form high quality nanoparticles with excellent structure; in which the second reaction temperature has to be in the temperature range sufficient to recrystallize nanoparticles. The nanoparticles grown with this process is not only of the feature of high density due to low temperature growth, but also of the advantages of high temperature growth.

EMBODIMENTS

The present invention comprises the following embodiments but is not limited thereto.

The periodic flow-rate modulated epitaxial growth of the present invention is to grow GaN nanoparticles on $Al_{0.11}Ga_{0.89}N$ buffer layer with low degree of lattice mismatch of ~0.25%.

EXAMPLE 1

Growth of GaN Binary Nanoparticles

Figure 5:
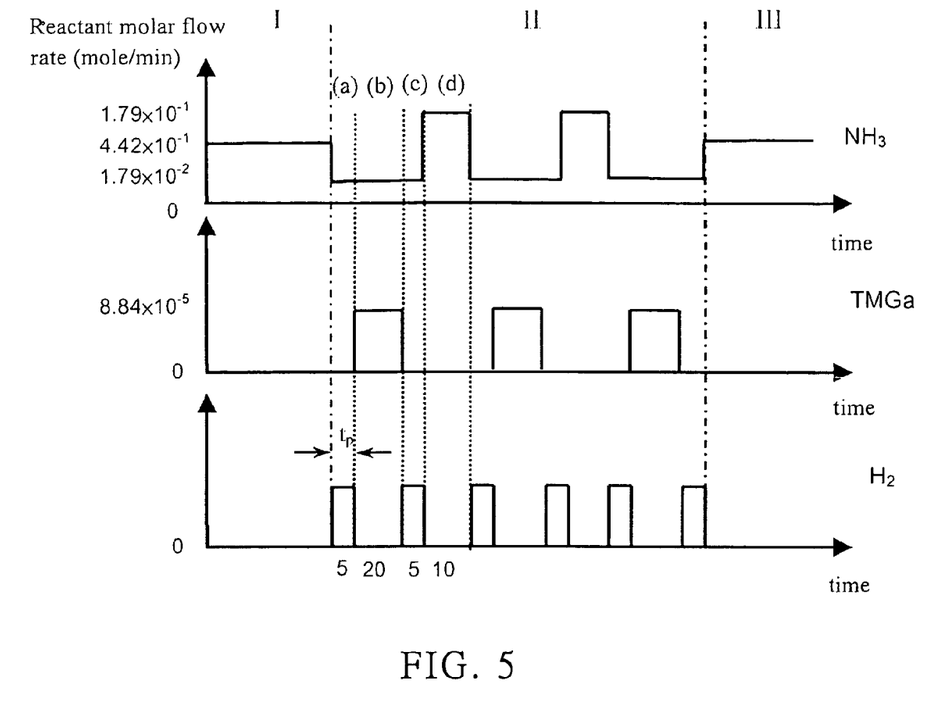
FIG. 5 is a time chart showing the modulation of reactant molar flow rate in the periodic flow-rate modulation epitaxy according to the present invention.

Firstly, a 2-inch (0001) sapphire substrate 1 was disposed into the reactor of the low-pressure metal-organic vapor phase deposition (LP-MOCVD) system. The reactor temperature was elevated to 1120° C., and by turning on hydrogen, the substrate was subject to heat treatment in hydrogen environment for 10 minutes. While maintaining constant reactor temperature, the molar flow rates of the reaction gases turned on was 6.98 μmole/min of trimethylaluminum (TMAl), $4.42 \times 10^1$ μmole/min of trimethylgallium (TMGa), and $8.93 \times 10^{-2}$ mole/min of ammonia ($NH_3$), to grow $Al_{0.11}Ga_{0.89}N$ buffer layer 2 with thickness of 0.5 μm. Subsequently, the reactor temperature was reduced to 900° C., the reactor pressure was controlled at 200 mbar, and the so-called "periodic flow-rate modulation epitaxy growth" was conducted. Said periodic flow-rate modulation epitaxy growth comprised:

In the first purge step (as shown in FIG. 5(a)), purge gas (hydrogen 3) was turned on to clean remaining excess $NH_3$ reactant, and $NH_3$ reactant 4 was modulated to the lower first molar flow rate range ($1.79 \times 10^{-2}$ mole/min), so that TMGa reactant turned on in next step was able to grow metal gallium or Ga-rich islands on $Al_{0.11}Ga_{0.89}N$ buffer layer below the first molar flow rate without the formation of 2D grown GaN film. Further, $NH_3$ reactant was modulated to the lower first molar flow rate to avoid re-evaporation of nitrogen atoms on the surface of $Al_{0.11}Ga_{0.89}N$ buffer layer in low grown temperature environment of 900° C., and the nitrogen vacancy defect on the surface of $Al_{0.11}Ga_{0.89}N$ buffer layer was reduced.

In TMGa reactant turn-on stage (as shown in FIG. 5(b)), TMGa reactant 5 was turned on with molar flow rate setting of $8.84 \times 10^{-5}$ mole/min for 20 seconds, to form metal gallium or Ga-rich islands on $Al_{0.11}Ga_{0.89}N$ buffer layer. Due to the surface energy of $Al_{0.11}Ga_{0.89}N$ (107 meV/Å$^2$), which was lower than the sum of that of metal gallium or Ga-rich islands (45 meV/Å$^2$) and the interface strain energy of $Al_{0.11}Ga_{0.89}N$ buffer layer (268.5 meV/Å$^2$), the 3D island growth condition of V-W mode was satisfied, so that islands 6 were formed on $Al_{0.11}Ga_{0.89}N$ buffer layer.

In the second purge stage (as shown in FIG. 5(c)), TMGa reactant was turned off, and purge gas 3 was turned on for 5 seconds to clean remaining TMGa reactant which did not form metal gallium or Ga-rich islands.

In $NH_3$ reactant turn-on stage (as shown in FIG. 5(d)); the molar flow rate of $NH_3$ reactant 4, which was modulated from below the first molar flow rate to above the second molar flow rate ($1.79 \times 10^{-1}$ mole/min), was turned on for 10 seconds, so that islands formed GaN nanoparticles 7 with excellent quality at sufficient $NH_3$ reactant molar flow rate.

Figure 6:
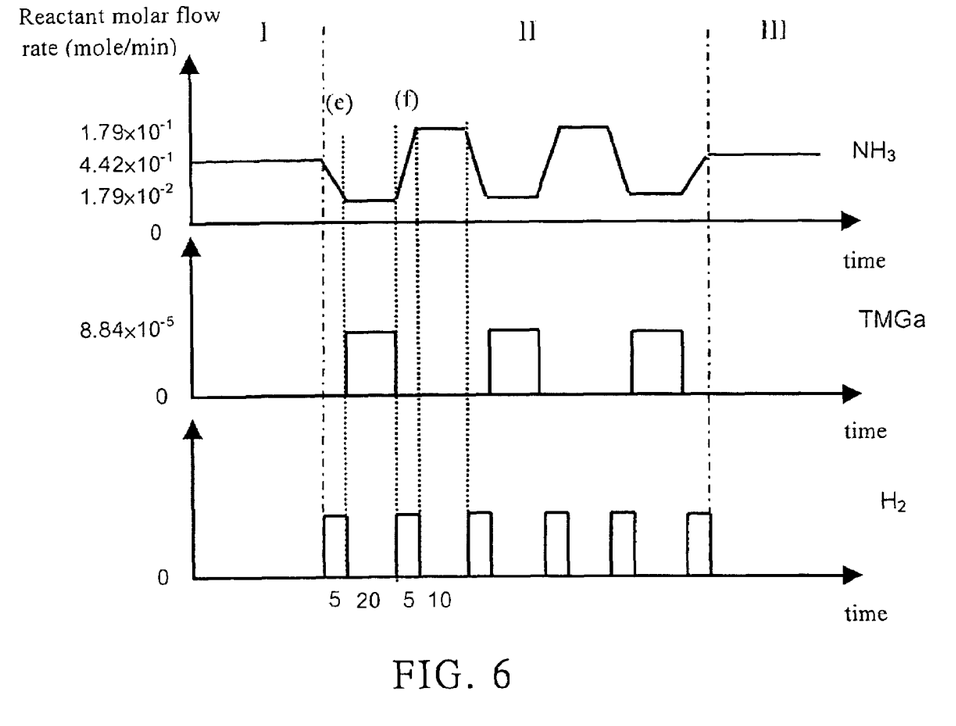
FIG. 6 is a time chart showing another modulation of reactant mole flow rate in the periodic flow-rate modulation epitaxy according to the present invention.

FIG. 6 shows another reactant flow rate modulation method in periodic flow-rate modulation epitaxy growth; i.e., in the above periodic flow-rate modulation epitaxy growth, $NH_3$ reactant molar flow rate in the first purge stage was modulated gradually to the lower first molar flow rate ($1.79 \times 10^{-2}$ mole/min) within purge stage period (as shown in FIG. 6(e)). After turning off TMGa reactant, $NH_3$ reactant flow rate modulation was able to modulated gradually from the lower first molar flow rate to the higher second molar flow rate ($1.79 \times 10^{-1}$ mole/min) (as shown in FIG. 6(f)).

EXAMPLE 2

Growth of Nanoparticles of Three or More Components

The procedure of modulating reactant molar flow rate when growing ternary nanoparticles is, the second and third reactants are turned on simultaneously after the first reactant molar flow rate is modulated to the lower first molar flow rate (as shown in FIG. 7), or the second reactant is turned on firstly.

Then the third reactant is turned on (as shown in FIG. 8) to form metal and metal-rich compound islands consisting of the second and third reactants on buffer layer, and the first reactant molar flow rate is modulated to the higher second molar flow rate, so that ternary nanoparticles with excellent structure are manufactured, such as: AlGaAs, InGaAs, AlInAs, AlGaP, InGaP, AlInP, AlAsP, InAsP, GaAsP, AlGaN, InGaN, AlInN, AlAsN, InAsN, GaAsN, ZnCdSe, ZnHgSe, ZnCdTe, ZnSeTe, SiCGe, SiCN etc. The same procedure is also applicable to the manufacture of nanoparticles of four or more components, such as: AlInGaAs, AlInGaP, AlInAsP, InGaAsP, AlAsPN, InAsPN, GaAsPN, AlInGaN, etc.

GaN and AlGaN nanoparticles manufactured in Examples 1 and 2 are also applicable to the production of UV-LED (<370 nm), which can be mixed with R-G-B tricolor fluorescence powders to produce white LED with color rendering index of higher than 90%.

EXAMPLE 3

Figure 10:
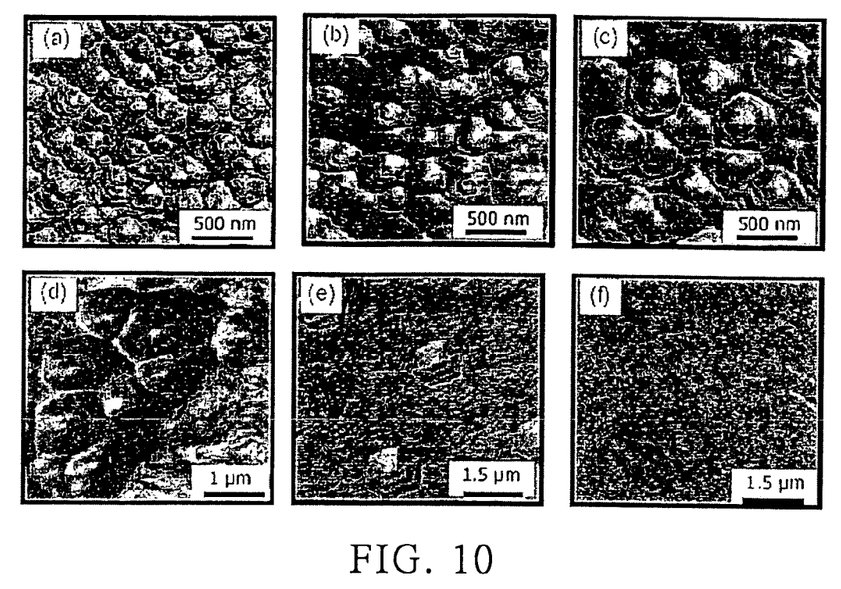
FIG. 10 is an atomic force microscopic image showing the gallium nitride nanoparticles according to the present invention grown at different temperatures: (a) 840, (b) 870, (c) 900, (d) 930, (e) 940, and (f) 960° C.

Temperature Control on Growth of High Quality Nanoparticles (1) Relationship Between Temperature and Growth Mode FIG. 10 is an atomic force microscopic image showing the gallium nitride nanoparticles according to the present invention grown at different temperatures by using periodic flow-rate modulation epitaxy. When the temperature was between 840~940° C., hexagonal pyramid gallium nitride nanoparticles were found on $Al_{0.11}Ga_{0.89}N$ buffer layer, and the hexagon was more obvious as temperature went higher, which meant the structure was better. However, when the growth temperature was above 960° C., no formation of gallium nitride nanoparticles was observed (as shown in FIG. 10(f)) Therefore, it is known that when the growth temperature is above 960° C. in reactant molar flow rate modulation, growth mode is changed from three dimensional to two dimensional layer-by-layer growth mode. Since the growth temperature is about 800° C. for ordinary MOVPE grown gallium nitride when changing from three dimension to two dimension growth mode, it implies that the present process is able to grow nanoparticles at higher temperature, and therefore obtain nanoparticles with better structure.

(2) Relationship Among Temperature, Nanoparticle Geometric Size and Density

Figure 11:
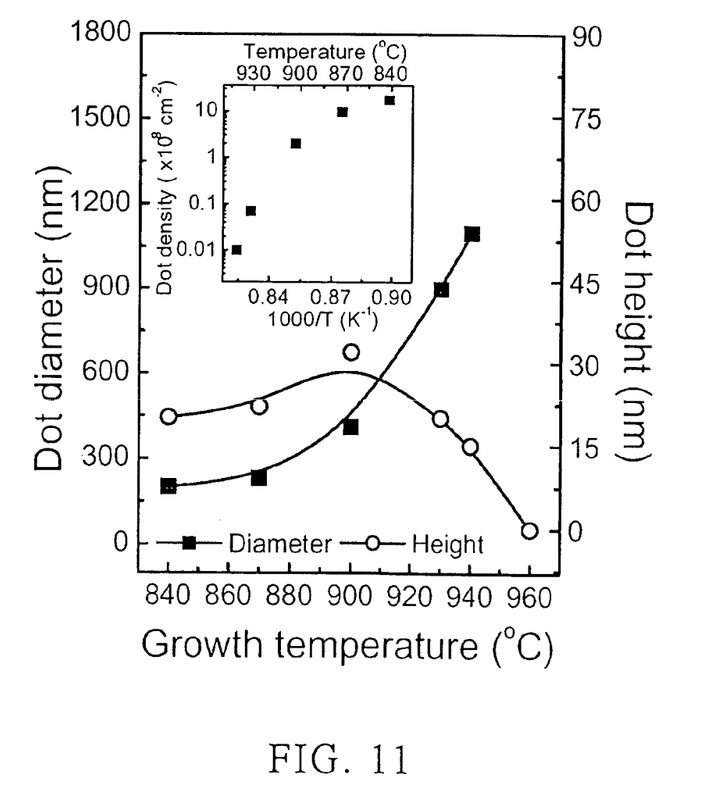
FIG. 11 is a graph showing the relationship among diameter, height and growth temperature of the gallium nitride nanoparticles according to the present invention, wherein an insert shows the relationship between nanoparticle density and growth temperature.

FIG. 11 is a graph showing the relationship among the average height, width and growth temperature of the gallium nitride nanoparticles. It was found in the figure that the width of the nanoparticles tended to broaden as the temperature was elevated. That's due to the fact that the migration distance for Ga adatoms on $Al_{0.11}Ga_{0.89}N$ buffer layer in higher temperature environment is longer than that in lower temperature environment, so that the diameter of nanoparticles in high temperature environment is larger than that in low temperature environment. Also, the height of nanoparticles tended to increase as the growth temperature went higher, and the maximum appeared at about 900° C.; however, the height of nanoparticles turned smaller at temperature above 900° C. That's due to the fact that the desorption effect for Ga adatoms is more obvious when the growth temperature is higher, so that the reactant concentration of nanoparticles capable to participate the reaction is reduced, and the height of nanoparticles decreases as the temperature is higher.

Further, it was found from the inserted graph in FIG. 11 showing the relationship between nanoparticle density and growth temperature, that when the growth temperature was elevated from 840 to 900° C., the nanoparticle density decreased from $1.7 \times 10^9$ to $3 \times 10^8$ cm$^{-2}$, and decreased sharply at above 900° C., and nanoparticles even completely disappeared at 960° C. This result shows growth temperature is a critical parameter to control nanoparticle density in periodic flow-rate modulation epitaxy.

(3) Effect of Temperature on Nanoparticle Quality

Figure 12:
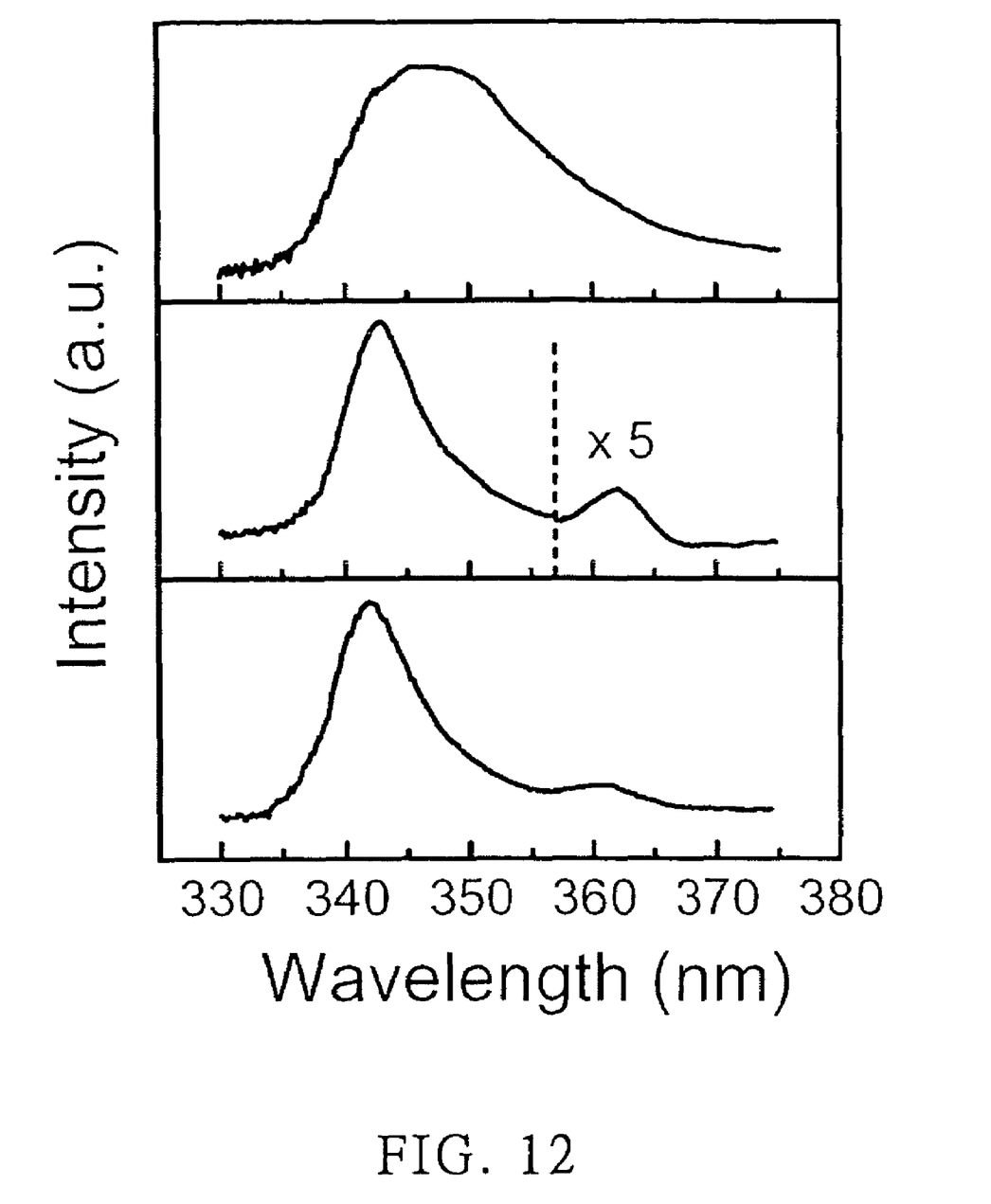
FIG. 12 a room temperature microphotoluminescence spectrum of the gallium nitride nanoparticles according to the present invention grown individually at temperatures: (a) 840° C., (b) 900° C., and (c) 960° C.

FIG. 12 is a room temperature microphotoluminescence spectrum of the gallium nitride nanoparticles grown at different temperatures. At growth temperature of 840° C., although hexagonal pyramid gallium nitride nanoparticles could be seen in atomic force microscopic image, the spectral signals thereof was a broad migration emission spectrums. It is assumed that the decomposition efficiency of ammonia is not high in low temperature growth, so that aluminum atoms on AlGaN buffer layer inter-diffused with gallium reactant turned on to form aluminum gallium nitride with inferior structure. When the growth temperature was elevated to 900° C., it was clearly observed that, in addition to a shift peak from aluminum gallium nitride consisting of 11% of aluminum at 342 nm, a gallium nitride nanoparticle-related peak was at 362 nm with high width of 49 meV. This is the only spectral signal of gallium nitride nanoparticle observed by microphotoluminescence at room temperature without growing capping layer in the world. When the growth temperature was further elevated to 960° C., there were peaks at 342 and 362 nm as observed in the previous nanoparticles grown at 900° C. It was known from the previous atomic force microscopic image that no gallium nitride nanoparticle was formed at growth temperature of 960° C. but there was gallium nitride-related signal at 362 nm. Therefore, it is confirmed that growth mode is changed to two dimensional layer-bt-layer at 960° C. Comparing to spectral signals of nanoparticles grown at 840 and 900° C., it is known that nanoparticles with better quality are obtained at growth temperature of 900° C., and lower growth temperature deteriorates the quality of nanoparticles.

Figure 13:
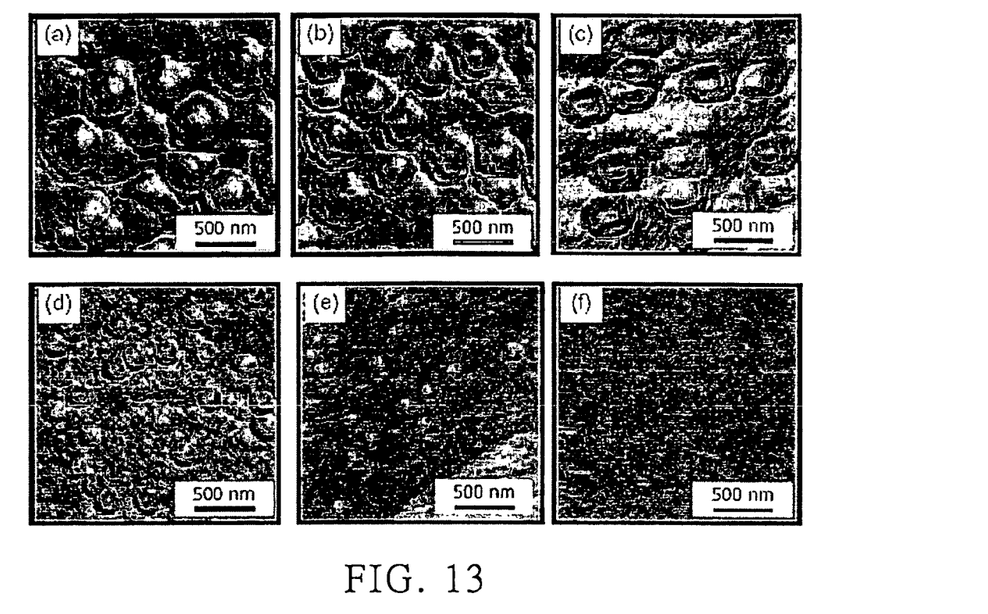
FIG. 13 is an atomic force microscopic image showing the gallium nitride nanoparticles according to the present invention grown at constant temperatures for different TMGa reactant turn-on periods: (a) 20, (b) 15, (c) 10, (d) 7, (e) 5, and (f) 0 second.
Figure 14:
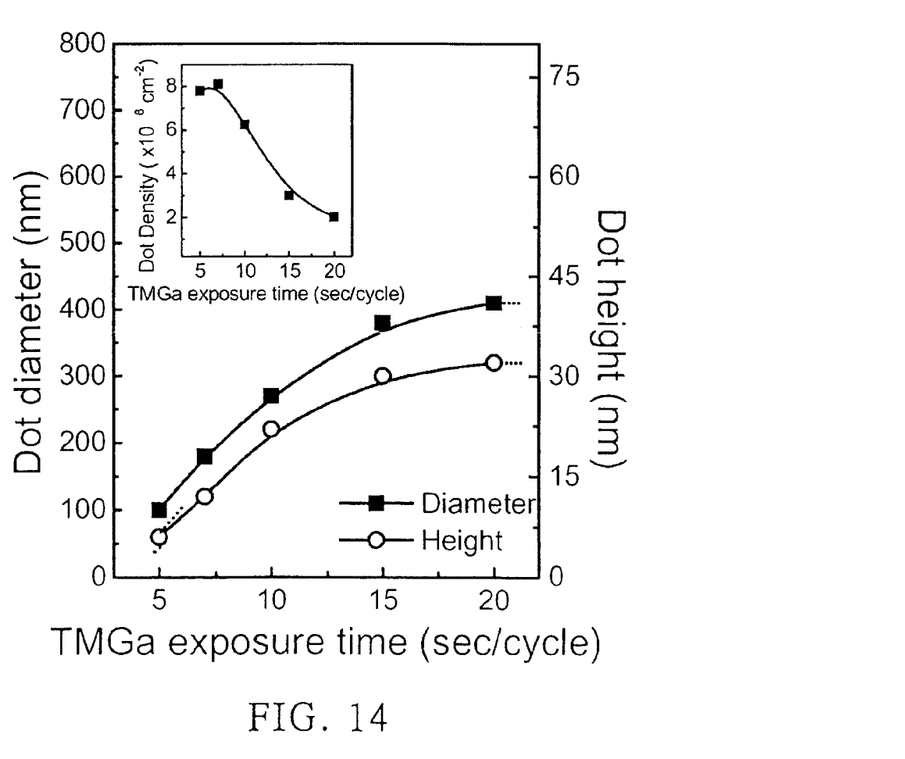
FIG. 14 is a graph showing the time relationship among diameter, height and TMGa reactant turn-on time of the gallium nitride nanoparticles according to the present invention, wherein an insert shows the time relationship between nanoparticle density and TMGa reactant turn-on time.

FIG. 13 is an atomic force microscopic image showing the gallium nitride nanoparticles grown at constant temperature while TMGa reactant turn-on period parameter was varied. It was found that the size of GaN nanoparticles was reduced as TMGa turn-on period was shortened. It was known from FIG. 14, which is a graph showing the relationship among gallium nitride nanoparticle diameter, height and TMGa reactant turn-on time, that when the turn-on time was reduced to 5 seconds, gallium nitride nanoparticles with 100 nm of diameter and height of 5 nm were obtained. It was known from the relationship between quantum dots density and TMGa turn-on time (as shown in the insert of FIG. 14), that when TMGa turn-on time was more than 10 seconds, density of nanoparticles was reduced as TMGa turn-on time was increased, and also assembling phenomenon appeared in atomic force microscopic image. Therefore, TMGa turn-on time is also a critical factor to control the size of nanoparticles.

DESIGNATION OF MAIN COMPONENTS

1 Substrate
2 Buffer layer
3 Purge gas
4 First reactant
5 Second reactant
6 Islands
7 Nanoparticles

We claim:

1. A process for manufacturing binary self-assembled nanoparticles, which comprises the steps of:
(I) providing a substrate, and forming an epitaxial buffer layer and part of device structure on the substrate;
(II) initially maintaining a first reactant at a given molar flow rate;
(III) completing at least one growth cycle for nanoparticle growth; and
(IV) maintaining the first reactant at another given molar flow rate to recrystallize the nanoparticles under a temperature equal to or higher than that of nanoparticle growth and completing the remaining device structure growth, then lowering to ambient temperature;
wherein the step (III) comprises:
(a) second reactant stage: modulating the first reactant molar flow rate into a low molar flow rate or a zero molar flow rate and a second reactant molar flow rate to a high molar flow rate to form metal or metal-rich compound islands on the buffer layer;
(b) first reactant stage: modulating the second reactant molar flow rate into a low molar flow rate or a zero molar flow rate and the first reactant molar flow rate into a high molar flow rate, so that metal or metal-rich compound islands form the binary nanoparticles.

2. The process as described in claim 1, where is applicable to epitaxy system such as MOCVD, MBE and HVPE using $H_2$, $N_2$, $H_2+N_2$ or any inert carrier gases, and wherein the binary nanoparticles comprise conductors, semiconductors, insulators, superconductors, or magnetic materials of Group III-V, II-VI or IV-IV.

3. The process as described in claim 1, wherein the first reactant is selected from elements of Group V, VI or IV, and the second reactant is selected from elements of Group III, II or IV.

4. The process as described in claim 1, wherein the growth temperature of the binary nanoparticles is 100-2000° C.

5. The process as described in claim 1, wherein the ster (III) further comprises modulation of given growth temperature to control the density range of the nanoparticles in $10^3$ to $10^{11}$ cm$^{-2}$.

6. The process as described in claim 1, wherein the step (III) further comprises modulation of given growth temperature to control the quality of the nanoparticles.

7. The process as described in claim 1, which further comprises completing the first growth cycle at a lower first temperature, and modulating growth temperature to the other higher temperature to complete remaining growth cycles, when the binary nanoparticles are formed by at least two growth cycles.

8. The process as described in claim 1, wherein the step (III) further comprises modulation of reactant turn-on time to control the size of the nanoparticles.

9. The process as described in claim 1, wherein at the second reactant stage, the second reactant molar flow rate modulation is direct switch or progressive modulation, in order to form the metal or metal-rich compound islands.

10. The process as described in claim 1, wherein the metal or metal-rich compound islands form nanoparticles of Group III-V, II-VI or IV-IV components including any one of GaAs, InAs, AlAs, GaP, InP, AlP, GaN, InN, AlN, ZnSe, ZnTe, CdSe, CdTe, HgTe, HgSe, SiGe, SiC, SiN.

11. The process as described in claim 1, wherein at the first reactant stage, the modulating molar flow rate of the first reactant into a high second molar flow rate is direct switch or progressive modulation, in order to form nanoparticles of Group III-V, II-VI or IV-IV components.

12. A process for manufacturing ternary self-assembled nanoparticles, which comprises the steps of:
(I) providing a substrate, and forming an epitaxial buffer layer and part of device structure on the substrate;
(II) initially maintaining a first reactant at a given molar flow rate;
(III) completing at least one growth cycle for nanoparticle growth; and
(IV) maintaining the first reactant at another given molar flow rate to recrystallize the nanoparticles under a temperature equal to or higher than that of nanoparticle growth and completing the remaining device structure growth, then lowering to ambient temperature;
wherein the step (III) comprises:
(a) second and third reactants stage: modulating the first reactant molar flow rate into a low molar flow rate or a zero molar flow rate and a second and third reactants molar flow rates into high molar flow rates to form metal or metal-rich compound islands on the underlying buffer layer;
(b) first reactant stage: modulating the second and third reactants molar flow rates into low molar flow rates or zero molar flow rates and the first reactant molar flow rate into a high molar flow rate, so that metal or metal-rich compound islands form the ternary nanoparticles.

13. The process as described in claim 12, wherein the ternary nanoparticles comprise conductors, semiconductors, insulators, superconductors, or magnetic materials of Group III-III-V, II-II-VI, or IV-IV-IV.

14. The process as described in claim 12, wherein the first reactant is selected from elements of Group V, VI or IV, and the second and third reactants are selected from elements of Group III, II or IV.

15. The process as described in claim 12, wherein the growth temperature of the ternary nanoparticles is 100-2000° C.

16. A device comprising a substrate, a buffer layer of any material on the substrate and nanoparticles in epitaxy which is grown on surface of the buffer layer;
wherein the nanoparticles are binary components according to the process of claim 1.

17. A device comprising a substrate, a buffer layer of any material on the substrate and nanoparticles in epitaxy which is grown on surface of the buffer layer;
wherein the nanoparticles are ternary components according to the process of claim 12.

18. The process as described in claim 1, the step (III) further comprises intervening purge stages in between the reactant stages, in which no reactant is introduced.

19. A process for manufacturing ternary self-assembled nanoparticles, which comprises the steps of:
(I) providing a substrate, and forming an epitaxial buffer layer and part of device structure on the substrate;
(II) initially maintaining a first and a second reactant at given molar flow rates;
(III) completing at least one growth cycle for nanoparticle growth; and
(IV) maintaining the first and the second reactants at another given molar flow rate to recrystallize the nanoparticles under a temperature equal to or higher than that of nanoparticle growth and completing the remaining device structure growth, then lowering to ambient temperature;
wherein the step (III) comprises:
(a) third reactant stage: modulating the first and second reactant molar flow rates into lower molar flow rates or zero molar flow rates and a third reactant molar flow rate into a high molar flow rate to form metal or metal-rich compound islands on the underlying buffer layer;

(b) first and second reactants stage: modulating the third reactant molar flow rate into a low molar flow rate or zero molar flow rate and the first and second reactant molar flow rates into high molar flow rates, so that metal or metal-rich compound islands form the ternary nanoparticles.

20. The process as described in claim 19, wherein the ternary nanoparticles comprise conductors, semiconductors, insulators, superconductors, or magnetic materials of Group III-V-V, II-VI-VI, or IV-IV-IV.

21. The process as described in claim 19, wherein the first and the second reactants are selected from elements of Group V, VI or IV, and the third reactant is selected from elements of Group III, II or IV.

22. The process as described in claim 19, wherein the growth temperature of the ternary nanoparticles is 100-2000° C.

23. A process for manufacturing quaternary compound self-assembled nanoparticles, which comprises the steps of:
    (I) providing a substrate, and forming an epitaxial buffer layer and part of device structure on the substrate;
    (II) initially maintaining m first group reactants that contain metal atoms (m=1,2 or 3) at given molar flow rates;
    (III) completing at least one growth cycle for nanoparticle growth; and
    (IV) maintaining the first group reactants at another given molar flow rate to recrystallize the nanoparticles under a temperature equal to or higher than that of nanoparticle growth and completing the remaining device structure growth, then lowering to ambient temperature;
    wherein the step (III) comprises:
    (a) second group reactants stage: modulating the m first group reactant molar flow rates into low molar flow rates or zero flow rates and a 4-m second group reactant molar flow rates into high molar flow rates to form metal or metal-rich compound islands on the underlying buffer layer;
    (b) first group reactants stage: modulating the 4-m second group reactant molar flow rates into low molar flow rates or zero flow rates and the first group reactant molar flow rates into high molar flow rates, so that metal or metal-rich compound islands form the quaternary nanoparticles.

24. The process as described in claim 23, wherein the first group reactants are selected from elements of Group III, II or IV, and the second group reactants are selected from elements of Group V, VI or IV.

25. The process as described in claim 1, wherein step (III) further comprises intervening purge stages between the reactant stages, in which no reactant is introduced.

26. The process as described in claim 12, wherein step (III) further comprises intervening purge stages between the reactant stages, in which no reactant is introduced.

27. The process as described in claim 19, wherein step (III) further comprises intervening purge stages between the reactant stages, in which no reactant is introduced.

28. The process as described in claim 23, wherein step (III) further comprises intervening purge stages between the reactant stages, in which no reactant is introduced.

29. A device comprising a substrate, a buffer layer of any material on the substrate and nanoparticles in epitaxy which is grown on surface of the buffer layer;
    wherein nanoparticles are ternary components according to the process of claim 19.

30. A device comprising a substrate, a buffer layer of any material on the substrate and nanoparticles in epitaxy which is grown on surface of the buffer layer;
    wherein nanoparticles are quarternery components according to the process of claim 23.

* * * * *